(12) United States Patent
Ueshima

(10) Patent No.: US 8,303,735 B2
(45) Date of Patent: Nov. 6, 2012

(54) LEAD-FREE LOW-TEMPERATURE SOLDER

(75) Inventor: Minoru Ueshima, Matsudo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 109 days.

(21) Appl. No.: 11/990,518

(22) PCT Filed: Aug. 18, 2006

(86) PCT No.: PCT/JP2006/316258
§ 371 (c)(1),
(2), (4) Date: Oct. 5, 2009

(87) PCT Pub. No.: WO2007/021006
PCT Pub. Date: Feb. 22, 2007

(65) Prior Publication Data
US 2010/0015004 A1    Jan. 21, 2010

(30) Foreign Application Priority Data
Aug. 18, 2005   (JP) ................ 2005-237036

(51) Int. Cl.
*B23K 35/26* (2006.01)
(52) U.S. Cl. .......... 148/400; 148/22; 148/442; 420/555; 420/577; 420/580
(58) Field of Classification Search ........... 148/400, 148/442, 22; 420/555, 577, 580
See application file for complete search history.

(56) References Cited

U.S. PATENT DOCUMENTS

| | | | |
|---|---|---|---|
| 6,521,176 B2 * | 2/2003 | Kitajima et al. | 420/562 |
| 2003/0178476 A1 * | 9/2003 | Kanai et al. | 228/248.1 |
| 2006/0067852 A1 | 3/2006 | Suh et al. | 420/555 |

FOREIGN PATENT DOCUMENTS

| | | | |
|---|---|---|---|
| EP | 715927 | * | 6/1996 |
| EP | 1916313 | | 4/2008 |
| JP | 2001198692 | | 7/2001 |
| JP | 2002-150906 | * | 5/2002 |
| JP | 2002150906 | | 5/2002 |
| JP | 2003013166 | | 1/2003 |

OTHER PUBLICATIONS

Erich Lugscheider and Stefania Ferrara: "Characterisation and Optimization of Innovative Solders for Transient Liquid Phase Bonding and Active Soldering", Advanced Engineering Materials, vol. 6, No. 3 (Mar. 18, 2004), pp. 160-163.
M. Ploetner: "Mechanical Properties of Soft Solders and their Dependence on Environmental and Load Conditions" from Lectures and Poster Show Contributions of the 6th International Conference on Interconnection Technology in Electronics (Feb. 1992), pp. 218-223.
Daewoong Suh et al, "A novel low-temperature solder based on intermetallic-compound phases with superior high-homologous temperature properties", Materials Letters 62 (2008), pp. 2017-2020.
H. Okamoto: "vol. 13 Phase Diagrams. Chapter: Bi-In (Bismuth-Indium) phase diagram", ASM Metalhandbook (1992).

* cited by examiner

*Primary Examiner* — Sikyin Ip
(74) *Attorney, Agent, or Firm* — Michael Tobias

(57) ABSTRACT

A conventional low-temperature solder containing Pb or Cd had problems with respect to environmental pollution. A conventional low-temperature lead-free solder had a liquidus temperature which was too high for low heat resistance parts having a heat resistance temperature of 130° C., or it was brittle or had low mechanical strength. A lead-free low-temperature solder according to the present invention comprises 48-52.5 mass % of In and a balance of Bi, and most of the structure is constituted by a $BiIn_2$ intermetallic compound which is not brittle. Zn or La can be added in order to further improve solderability, and a small amount of P can be added to prevent corrosion at high temperatures and high humidities.

16 Claims, No Drawings

LEAD-FREE LOW-TEMPERATURE SOLDER

TECHNICAL FIELD

This invention relates to a low-temperature solder which can be soldered at such a low temperature that does not cause thermal effects on a member being soldered. In particular, it relates to a lead-free low-temperature solder for bonding electronic parts and to a soldered joint.

BACKGROUND ART

Some electronic parts and electronic materials which are incorporated into electronic equipment do not have heat resistance and deteriorate in function or break when exposed to high temperatures. Such electronic parts and electronic materials must be soldered at a low temperature. For this purpose, a solder having a low melting point, i.e., a low-temperature solder must be used. There is no precise definition of a low-temperature solder, but in general it indicates one having a solidus temperature and a liquidus temperature (melting point) which are lower than 183° C., which is the eutectic temperature of Pb-63Sn alloy.

Conventional low-temperature solders include Sn-52Bi-32Pb (melting point of 95° C.), Sn-54Bi-20Cd (melting point of 103° C.), Sn-40Pb-40Bi (melting point of 113° C.), Sn-52In (melting point of 117° C.), Sn-58Bi (melting point of 139° C.), Sn-32Pb-18Cd (melting point of 143° C.), Sn-32Cd (melting point of 175° C.), and the like.

The solidus temperature and liquidus temperature of a solder alloy can be adjusted by adding a suitable amount of Pb or Cd, thereby making it possible to obtain low-temperature solders having various melting points. However, as low-temperature solders containing Pb or Cd cause environmental problems in that they produce adverse effects on humans, their use has come to be regulated. Accordingly, there is a demand for low-temperature solders which do not contain Pb or Cd.

Electronic parts equipped with semiconductor elements such as Peltier elements which have started to be used in recent electronic equipment has a heat resisting temperature of at most 130° C. Therefore, they have low heat resistance compared to typical electronic parts. When electronic parts having such low heat resistance (referred to below as low heat resistance parts) are soldered, the soldering temperature must of course be lower than 130° C.

In general, an appropriate soldering temperature is considered to be 20-40° C. higher than the liquidus temperature of the solder being used. Accordingly, low-temperature solder used for soldering low heat resistance parts must have a liquidus temperature of around 100° C., i.e., in the range of 90-110° C.

The temperature of use of typical electronic equipment is from −40° C. in Arctic regions to +85° C. in direct sunlight in the tropics. Therefore, a low-temperature solder used for soldering of low heat resistance parts must have sufficient resistance to thermal fatigue from −40° C. to +85° C., and its solidus temperature must be at least 85° C. so that the solder does not melt at the highest temperatures to which electronic equipment is exposed.

Because solder bonds two metals (base metals) to each other through a soldered joint, various bonding characteristics are required of solder. First, for example, solder must have solderability such that it can easily wet the base metals. Even if its solderability is not extremely good as can be obtained with conventional Pb-63Sn solder, it must be solderability of a level that does not impede the production of electronic equipment.

Solder are also required to form soldered joints having excellent mechanical properties (tensile strength, bending properties, elongation, etc.). Namely, when a tensile force is applied to a base metal which was soldered, if the soldered joint easily peels off, electronic equipment becomes completely unable to function. Similarly, when a bending force is applied to a base metal of a soldered joint, the solder must have sufficient ductility to prevent it from easily breaking by surrendering to the bending force.

Solder also requires corrosion resistance. When soldered electronic equipment is only used indoors, corrosion is not a problem because there is not much of a difference between cold and hot and the environment is good. However, electronic equipment used in equipment for data communication stations, automobiles, military equipment, equipment for outer space, equipment for outdoor recreation, and the like is often disposed outdoors, where corrosion of solder becomes a problem. Outdoors, there is a large temperature difference between day and night. If electronic equipment is exposed to a high temperature during the day and a low temperature at night, humid air in the periphery of soldered joints during the day causes moisture to condense on soldered joints at the low temperature at night. Since solder and base metals are made of different metals, they naturally have different ionization tendencies, and the condensed moisture forms an electrolytic solution, resulting in the formation of a local cell between the base metals and the solder. As a result, the base metals or the solder ends up electrically corroding. Corrosion of a soldered joint initially affects the electrical conductivity thereof. As the corrosion proceeds, conduction is completely lost between the base metals, and the electronic equipment can no longer perform its function.

Summarizing the above, the conditions now demanded for a low-temperature solder for soldering of low heat resistance parts are as follows.

(1) The solder does not contain Pb or Cd.

(2) Its liquidus temperature is at most 110° C., and its solidus temperature is at least 85° C.

(3) The solder has resistance to thermal fatigue from −40° C. to +85° C.

(4) It has appropriate solderability.

(5) The solder has appropriate mechanical properties such as mechanical strength, bending properties, ductility, and elongation.

(6) It is not susceptible to corrosion.

A Sn-58Bi based low-temperature solder which has been used from in the past for soldering of electronic equipment has a liquidus temperature of 139° C. Therefore, it cannot be used for soldering of low heat resistance parts like those described above (which have a heat resistance temperature of 130° C.). A Sn-52In based low-temperature solder has a solidus temperature and liquidus temperature of 117° C., but this solder does not have sufficient solderability or resistance to thermal fatigue, so it had problems with respect to reliability.

Patent Document 1 proposes a Bi—In based low-temperature solder. One example of the solder disclosed therein has a composition in the range of 50-83 atomic % In (35.4-72.8 mass %) and a balance of Bi. The low-temperature solder disclosed in Patent Document 1 is for joining wiring patterns of optical heads and optical modules. This Bi—In based low-temperature solder is formed into a powder and mixed with a flux for use as a solder paste.

Patent Document 1: JP 2001-198692 A1

DISCLOSURE OF INVENTION

The solder which is specifically disclosed as an embodiment in Patent Document 1 has a composition consisting of In, Bi, and Sn, and its liquidus temperature (bonding temperature) is approximately 78.8° C.

Concerning a Bi—In alloy, paragraph 0017 of Patent Document 1 refers to as preferred examples an alloy having a eutectic composition containing approximately 66.7 mass % of In and a balance of Bi and an alloy having a peritectic composition of approximately 52.3 mass % of In and a balance of Bi. However, with the eutectic composition, the solder has a melting point of 73° C., which is too low. On the other hand, with peritectic composition, the entire structure of the solder is constituted by a $BiIn_2$ intermetallic compound.

Paragraph 0018 of the same document describes that the bonding temperature, i.e., the liquidus temperature of the solder can be varied by varying its In content. However, the range for In is a quite wide one of from at least 35.4 mass % to at most 72.8 mass %. It is described that in this range, the bonding temperature is 70-100° C., with the liquidus temperature becoming at least 110° C. with an In content of less than 35.4 mass %. Moreover, there is no disclosure whatsoever concerning what specific properties a solder alloy having such a composition would have.

For example, in Patent Document 1, a composition having an In content of 50 atomic % (35.4 mass %) is used for soldering at a high temperature. However, this alloy composition containing 50 atomic % of In forms a BiIn intermetallic compound. Since a BiIn intermetallic compound is brittle, if an alloy containing 50 atomic % of In is used as solder, soldered joints are easily broken by external impacts. In Bi—In alloys, a composition which gives a brittle alloy is not limited to this composition containing 50 atomic % of In, but it also includes compositions in the vicinity of this composition, i.e., compositions containing a large amount of a BiIn intermetallic compound in the structure. These compositions are unsuitable as solder.

In Patent Document 1, a composition having a large amount of In is up to the composition having an In content of 83 atomic % which includes a eutectic composition of In and BiIn. The eutectic temperature of In and BiIn is 73° C. It is described therein that a composition up to the vicinity of this low eutectic temperature composition can be used for soldering optical modules.

In electronic equipment which is of interest in the present invention and particularly electronic equipment incorporating electronic parts having semiconductor elements such as Peltier elements, heat is generated not only by the electronic parts but also by members in the vicinity thereof such as circuit boards, and the temperature inside the equipment may reach 60° C. or above. If a solder alloy having a solidus temperature of less than 85° C. is used in this electronic equipment, it is not possible to maintain the bonding strength of soldered joints in the electronic equipment. Therefore, in the present invention, the solidus temperature of a solder alloy is made at least 85° C. In the case of a solder alloy having the eutectic composition disclosed in Patent Document 1, the solidus temperature of a composition containing such a large amount of In falls below 85° C. As a result, if the temperature of the surrounding atmosphere rises close to 85° C. after soldering, the resulting soldered joints end up melting and are detached. Accordingly, such a composition cannot be used. On the other hand, a solder alloy of a peritectic composition containing a smaller amount of In than the eutectic composition comprises a $BiIn_2$ intermetallic compound, leading to a considerable deterioration in brittleness. Therefore, it was thought that such a solder alloy was not suitable for use in soldering.

The present invention provides a low-temperature solder which is lead free, which has a liquidus temperature of at most 110° C. and a solidus temperature of at least 85° C., which does not exhibit brittleness, which can easily undergo plastic working, and which also has excellent resistance to thermal fatigue. The present invention also provides a soldered joint formed from the solder.

The present inventors unexpectedly found that a $BiIn_2$ intermetallic compound formed by a Bi—In binary alloy having a composition in a specific range with an In content of at least 48 mass % and at most 52.5 mass % and preferably at most 52.3 mass % and still more preferably less than 52.3 mass % is not brittle. A Bi—In alloy having a composition in this range has a liquidus temperature required of a low-temperature solder, and it has excellent resistance to thermal fatigue and excellent solderability. They thereby completed the present invention.

The present invention is a low-temperature lead-free solder for electronic parts which is a low-temperature lead-free solder comprising 48-52.5 mass % of In and a balance of Bi, characterized by having a solidus temperature of at least 85° C. and a liquidus temperature of at most 110° C. and having a $BiIn_2$ intermetallic compound present in its structure.

In the present invention, at least one additional intermetallic compound selected from $Bi_3In_5$ and BiIn may also be present.

In the alloy composition of the present invention, more preferably In is 50.0-52.0 mass %.

The alloy composition may also contain 0.01-0.4 mass % of Zn and/or 0.05-0.4 mass % of La.

According to a more preferred embodiment of the present invention, 0.001-0.01 mass % of P is added to the alloy.

From another standpoint, the present invention is a soldered joint in an electronic part formed from the above-described solder alloy.

A lead-free low-temperature solder according to the present invention contains no Pb or Cd whatsoever, so it is entirely free of environmental problems. In addition, since a lead-free low-temperature solder according to the present invention has a solidus temperature of at least 85° C. and a liquidus temperature in the vicinity of 100° C., even if the periphery of soldered joints comes close to 85° C., the soldered joints do not melt, and in addition, soldering can be carried out at a temperature of up to 130° C. As a result, thermal damage is not imparted to parts with low heat resistance.

Furthermore, because a lead-free low-temperature solder according to the present invention has the resistance to thermal fatigue, solderability, and mechanical properties demanded of solder, it can form reliable soldered joints.

BEST MODE FOR CARRYING OUT THE INVENTION

A low-temperature lead-free solder according to the present invention is a Bi—In based alloy which contains In in an amount in the range of 48-52.5 mass %. In this range, the low-temperature lead-free solder has a structure in which a large amount of a $BiIn_2$ intermetallic compound is present. Up to now, such intermetallic compound was considered brittle and lacking ductility. However, unlike other intermetallic compounds, the $BiIn_2$ intermetallic compound was found to have almost no brittleness and to exhibit ductility.

Thus, the composition of a solder alloy according to the present invention has an In content which is lower than that of a so-called peritectic composition, and the BiIn$_2$ intermetallic compound which constitutes the structure of a solder alloy according to the present invention is a highly ductile intermetallic compound which does not have brittleness characteristic of intermetallic compounds.

During solidification of a solder alloy according to the present invention, BiIn and Bi$_5$In$_3$ in fact crystallize as initial crystals, and then ductile BiIn$_2$ grows in the periphery of these brittle intermetallic compounds by a peritectic reaction. As a result, the brittle intermetallic compounds BiIn and Bi$_5$In$_3$ are dispersed in the highly ductile BiIn$_2$ intermetallic compound, thereby improving the strength of the highly ductile BiIn$_2$ intermetallic compound. However, if a large amount of BiIn and Bi$_5$In$_3$ crystallize as initial crystals, they adheres to each other, and the ductility of the alloy itself cannot be improved even if highly ductile BiIn coexists. Therefore, the excellent properties of the present invention are exhibited only in an extremely narrow range of composition in which In is at least 48 mass % and at most 52.5 mass % and preferably at most 52.3 mass %.

Accordingly, when the BiIn$_2$ intermetallic compound is present in the structure as in the low-temperature lead-free solder of the present invention, it is not only possible to perform plastic working so as to form the solder into a wire, it also becomes difficult for peeling of a soldered joint to occur if the joint receives an external impact.

If the amount of In is less than 48 mass %, the amount of BiIn intermetallic compound which is precipitated becomes so large that brittleness develops. In addition, the solder has a liquidus temperature exceeding 100° C., and the soldering temperature becomes high and causes thermal damage to low heat resistance parts. On the other hand, if the amount of In is more than 52.5 mass %, the solidus temperature falls below 85° C., and the solder is no longer heat resistant.

Taking into consideration the soldering temperature of low heat resistance parts and resistance to thermal fatigue, the solidus temperature is preferably at least 87° C. and the liquidus temperature is preferably at most 90° C. A suitable In content for satisfying these conditions is 50.0-52.0 mass %.

A solder according to the present invention can undergo plastic working due to the presence of ductile BiIn$_2$ in the alloy structure. However, depending upon the composition of a Bi—In alloy, Bi$_3$In$_5$ and BiIn intermetallic compounds sometimes precipitate in addition to BiIn$_2$. These Bi$_3$In$_5$ and BiIn intermetallic compounds are brittle. However, when these compounds are present in grains of a ductile BiIn$_2$ intermetallic compound, the alloy as a whole becomes ductile. In a Bi—In based alloy having an In content of 48-52.5 mass %, some compositions have BiIn$_2$ in which Bi$_3$In$_5$ or BiIn coexist. Theoretically, when the In content in this composition is 50-52 mass %, at least 50% of the structure is constituted by BiIn$_2$, and the ductility of the alloy is further improved.

A Bi—In binary alloy according to the present invention can be used for soldering which satisfies the requirements for soldering of low heat resistance parts. However, if even better solderability is desired, Zn or La can be added individually or at the same time to this binary alloy.

When Zn is added to a Bi—In alloy, it does not produce an effect of increasing wettability if its content is less than 0.01 mass %, while if its content exceeds 0.4 mass %, it increases the liquidus temperature of solder so as to exceed 120° C., and the soldering temperature exceeds 130° C.

The addition of La to a Bi—In alloy has the effect of supplementing the action performed by flux of removing a surface oxide film on solder. However, if its content is less than 0.01 mass %, the cohesiveness of solder decreases, while if it is added in an amount larger than 0.4 mass %, the liquidus temperature increases to such a degree that the soldering temperature exceeds a prescribed range. Preferably the La content is at least 0.05 mass %.

In order to prevent corrosion at high temperatures and high humidities, a lead-free low-temperature solder according to the present invention may contain 0.001-0.01 mass % of P. P can be added to a Bi—In alloy or to an alloy obtained by adding Zn or La individually or at the same time to a Bi—In alloy. In either case, if the added amount of P is smaller than 0.001 mass %, the effect of preventing corrosion is not obtained, while if it is added in excess of 0.01 mass %, the liquidus temperature increases and solderability is worsened.

EXAMPLES

The alloys having the compositions shown in Table 1 were prepared. They were melted and formed into ingots, from which test pieces for use in various tests were prepared. The presence of a BiIn$_2$ intermetallic compound in examples of compositions in the range of the present invention was ascertained by an x-ray diffraction test.

Each alloy was subjected to differential thermal analysis, tests for mechanical properties, a solderability test, a wettability test, a cohesion test, a corrosion test, and a thermal fatigue resistance test. The test procedures and the evaluation standards are summarized below.

The test results are shown in Table 1 for examples of the present invention and comparative examples.

TABLE 1

|  |  | Composition | Melting temperature (*1) | | | Mechanical properties (*2) | | | |
|---|---|---|---|---|---|---|---|---|---|
|  |  |  | Solidus temp. (° C.) | Liquidus temp. (° C.) | Evaluation | Tensile strength (*3) | Elongation (*4) | Bending properties (*5) | Evaluation |
| This Invention | 1 | Bi—48In | 88.5 | 91.5 | ○ | 8.0 | 35.0 | Acceptable | ○ |
|  | 2 | Bi—49In | 88.4 | 90.8 | ○ | 8.3 | 33.0 | Acceptable | ○ |
|  | 3 | Bi—50In | 88.4 | 90.2 | ○ | 6.5 | 33.0 | Acceptable | ○ |
|  | 4 | Bi—51In | 88.5 | 90.0 | ○ | 8.9 | 35.0 | Acceptable | ○ |
|  | 5 | Bi—52In | 88.4 | 89.9 | ○ | 8.7 | 34.0 | Acceptable | ○ |
|  | 6 | Bi—51In—0.01Zn | 88.0 | 90.8 | ○ | 8.9 | 36.0 | Acceptable | ○ |
|  | 7 | Bi—51In—0.05Zn | 87.7 | 90.5 | ○ | 9.0 | 36.0 | Acceptable | ○ |
|  | 8 | Bi—51In—0.1Zn | 87.7 | 90.6 | ○ | 8.9 | 35.0 | Acceptable | ○ |
|  | 9 | Bi—51In—0.2Zn | 87.7 | 90.8 | ○ | 8.7 | 34.0 | Acceptable | ○ |
|  | 10 | Bi—51In—0.3Zn | 87.5 | 100.0 | ○ | 8.6 | 32.0 | Acceptable | ○ |

TABLE 1-continued

|  |  | Composition |  |  |  |  |  |  |  |
|---|---|---|---|---|---|---|---|---|---|
|  | 11 | Bi—51In—0.2Zn—0.1La | 87.7 | 90.8 | ○ | 8.9 | 35.0 | Acceptable | ○ |
|  | 12 | Bi—51In—0.2Zn—0.001P | 87.6 | 90.9 | ○ | 8.0 | 33.0 | Acceptable | ○ |
|  | 13 | Bi—51In—0.2Zn—0.01P | 87.7 | 91.9 | ○ | 8.3 | 38.0 | Acceptable | ○ |
| Comparison | 1 | Bi—33In | 109.0 | 110.0 | ○ | 16.0 | 0 | Unacceptable | X |
|  | 2 | Bi—46In | 91.4 | 92.3 | ○ | 12.0 | 0 | Unacceptable | X |
|  | 3 | Bi—54In | 72.4 | 88.8 | X | Melted | - | Acceptable | X |
|  | 4 | Bi—55In | 72.4 | 87.5 | X | Unmeasurable |  | Acceptable | X |
|  | 5 | Bi—60In | 72.4 | 83.3 | X |  |  | Acceptable | X |
|  | 6 | Bi—51In—0.5Zn | 87.7 | 128.0 | X | 9.0 | 38.0 | Acceptable | ○ |
|  | 7 | Bi—51In—0.8Zn | 87.6 | 150.0 | X | 8.8 | 28.0 | Acceptable | ○ |
|  | 8 | Bi—51In—1Zn | 87.7 | 165.0 | X | 7.0 | 28.0 | Acceptable | ○ |
|  | 9 | Bi—51In—2Zn | 108.0 | 216.0 | X | 6.8 | 25.0 | Acceptable | ○ |
|  | 10 | Bi—33In—0.25Zn | 108.0 | 110.0 | ○ | 15.0 | 0 | Unacceptable | X |

|  |  |  | Solderability (*6) | | | Corrosion resistance (*9) | Resistance to thermal fatigue (*10) |
|---|---|---|---|---|---|---|---|
|  |  | Composition | Cu plate (*7) | Cohesive-ness (*8) | Evalu-ation |  |  |
| This Invention | 1 | Bi—48In | B | B | ○ | B | Acceptable |
|  | 2 | Bi—49In | B | B | ○ | B | Acceptable |
|  | 3 | Bi—50In | B | B | ○ | B | Acceptable |
|  | 4 | Bi—51In | B | B | ○ | B | Acceptable |
|  | 5 | Bi—52In | B | B | ○ | B | Acceptable |
|  | 6 | Bi—51In—0.01Zn | A | C | ○ | B | Acceptable |
|  | 7 | Bi—51In—0.05Zn | A | C | ○ | B | Acceptable |
|  | 8 | Bi—51In—0.1Zn | A | C | ○ | B | Acceptable |
|  | 9 | Bi—51In—0.2Zn | A | C | ○ | B | Acceptable |
|  | 10 | Bi—51In—0.3Zn | A | C | ○ | B | Acceptable |
|  | 11 | Bi—51In—0.2Zn—0.1La | A | A | ○ | B | Acceptable |
|  | 12 | Bi—51In—0.2Zn—0.001P | A | B | ○ | B | Acceptable |
|  | 13 | Bi—51In—0.2Zn—0.01P | A | B | ○ | A | Acceptable |
| Comparison | 1 | Bi—33In | B | B | ○ | B | — |
|  | 2 | Bi—46In | B | B | ○ | B | — |
|  | 3 | Bi—54In | B | B | ○ | C | — |
|  | 4 | Bi—55In | B | B | ○ | C | — |
|  | 5 | Bi—60In | B | B | ○ | C | — |
|  | 6 | Bi—51In—0.5Zn | A | C | ○ | C | — |
|  | 7 | Bi—51In—0.8Zn | A | D | X | C | — |
|  | 8 | Bi—51In—1Zn | A | D | X | C | — |
|  | 9 | Bi—51In—2Zn | A | D | X | C | — |
|  | 10 | Bi—33In—0.25Zn | A | B | ○ | C | — |

Explanation of Table 1

(*1) A heating curve was plotted using a melting temperature differential thermal analyzer, and the melting temperatures (solidus temperature and liquidus temperature) were determined from the state of heat absorption. The rate of temperature increase was 5° C. per minute, and the samples weight was 10 mg. Samples for which the liquidus temperature was at most 110° C. and the solidus temperature was at least 85° C. are indicated by "○", and samples for which the liquidus temperature exceeded 110° C. or the solidus temperature was less than 85° C. are indicated by "X".

(*2) Mechanical properties: Tensile strength, elongation, and bending properties were measured. Samples for which these test results were all acceptable are indicated by "○", and those for which even one test result was unacceptable are indicated by "X".

(*3) Tensile strength: A JIS Z 2201 No. 4 test piece was prepared from the solder to be tested, and the tensile strength was measured in a high-temperature atmosphere at 80° C. A tensile strength of at least 6 MPa at 80° C. was acceptable.

(*4) Elongation: The elongation of the test piece was measured after the tensile test in the above-described tensile strength test. Solder can undergo plastic working to be formed into solder wire if its elongation is at least 10%. Therefore, an elongation of at least 10% was acceptable.

(*5) Bending properties: The solder was formed into a test piece measuring 3 × 10 × 15 (mm). The test piece was bent to 90° at room temperature, and the presence or absence of fracture in the test pieces was observed. Test pieces which were bent to 90° without fracture were rated as having acceptable ductility, and those which fractured were rated as having unacceptable ductility.

(*6) Solderability: Samples for which wettability on a copper plate and cohesiveness were both acceptable were evaluated as "○", and samples for which at least one of these properties was unacceptable were evaluated as "X".

(*7) Wettability on a copper plate: A rosin flux was applied by printing to a thickness of 0.15 mm and a diameter of 6.5 mm on a copper plate having flash plating of gold, and a piece of solder measuring 0.3 mg was placed atop the applied flux. The solder on the Cu plate was then held for 30 seconds at 80-85° C., and then it was held for 40 seconds at 100° C. and then at 120° C. Samples which wet the copper plate at 100° C. are indicated as A, those which wet the copper plate at 120° C. are indicated as B, and those which did not wet the copper plate even at 120° C. are indicated as C. A and B were acceptable, and C was unacceptable.

(*8) Cohesiveness: A resin flux was applied by printing to a thickness of 0.15 mm and a diameter of 6.5 mm atop a ceramic plate, and a piece of solder measuring 0.3 mg was placed atop the applied flux. The solder on the ceramic plate was then held for 30 seconds at 80-85° C., and then it was held for 40 seconds at 100° C. and then at 120° C. Samples for which the solder completely cohered at 100° C. are indicated as A, samples for which the solder completely cohered at 120° C. are indicated as B, samples for which the piece of solder remained at 120° C. without melting and which had an edge with an obtuse angle are indicated as C, and samples for which the piece of solder remained at 120° C. without melting and which had an edge with an acute angle are indicated as D. A, B, and C were acceptable, and D was unacceptable.

(*9) Corrosion resistance: A test piece was obtained by immersing a JIS No. 2 comb-shaped electrode substrate in a melt of the solder to be tested to cause the solder to adhere to the circuit on the substrate. The test piece was kept for 500 hours in a high-temperature, high-humidity environment at a temperature of 85° C. and a relative humidity of 85%, and the advance of corrosion in a cross section was observed with a SEM. Samples having oxides at a depth of at most 2 μm from the surface were evaluated as A, samples having oxides at a depth of at most 10 μm from the surface were evaluated as B, and samples having oxides at a depth of more than 10 μm from the surface were evaluated as C. A and B were acceptable, and C was unacceptable.

(*10) Resistance to thermal fatigue: Samples were obtained by mounting a 400-pin CSP measuring 120 × 120 × 1 (mm) on a 0.8 mm FR4 circuit board by soldering at a peak temperature of 120° C. The sample was repeatedly held at −40° C. and at +85° C. each for 30 minutes, and every 100 cycles, a conduction test was carried out at room temperature. A sample was evaluated as NG when its resistance increased by at least 20%. Ten samples were tested for each alloy (N = 10). The target result was for there to be no occurrence of NG for all ten samples at 500 cycles. Because a test of resistance to thermal fatigue takes a long time, it was not performed on those alloys which were determined to be unacceptable in the other tests. Those alloys are indicated by a dash (—) in the table.

As can be seen from the results in Table 1, all the lead-free low-temperature solders according to the present invention had a solidus temperature of at least 87° C. and a liquidus temperature of at most 110° C. Accordingly, a lead free solder according to the present invention can employ a soldering temperature which is at most 130° C., which is the heat resistance temperature of low heat resistance parts. Therefore, low heat resistance parts do not undergo thermal damage and are not destroyed.

In addition, none of the low-temperature lead-free solders according to the present invention fractured in the 90° bending test, and their tensile strength at 80° C. was at least 8 MPa. Therefore, they are sufficiently reliable in that they do not readily fracture when the periphery of a soldered joint reaches a high temperature after soldering.

In addition, because a lead-free low-temperature solder according to the present invention has elongation of at least 10%, it can be formed into wire solder. Furthermore, a lead-free low-temperature solder according to the present invention has excellent wettability with respect to Cu electrodes and Au electrodes, so soldering can be carried out without soldering defects.

INDUSTRIAL APPLICABILITY

A low-temperature lead-free solder according to the present invention is optimal as a bonding material for soldering at a low temperature electronic parts having a heat resistance temperature of 130° C. such as electronic parts incorporating semiconductor elements such as Peltier elements. However, it can also provide excellent effects if used for other members which do not have heat resistance and which need bonding strength, such as PPLP.

The invention claimed is:

1. A lead-free low-temperature solder for bonding electronic parts consisting of 50-52 mass % of In, at least one of 0.01-0.4 mass % of Zn and 0.01-0.4 mass % of La, optionally 0.001-0.01 mass % of P, and a balance of Bi and having a solidus temperature of at least 85° C. and a liquidus temperature of at most 110° C. and having a $BiIn_2$ intermetallic compound and at least one intermetallic compound selected from $Bi_3In_5$ and BiIn present in its structure.

2. A solder joint which is bonded to an electronic part containing a semiconductor element and which is made from a lead-free low-temperature solder as claimed in claim 1.

3. A solder joint as claimed in claim 2 which bonds the electronic part to a circuit board.

4. A solder joint as claimed in claim 2 which bonds a chip scale package to a circuit board.

5. A solder joint as claimed in claim 2 wherein the electronic part is a Peltier element.

6. A solder joint for an electronic part made from a lead-free low-temperature solder as claimed in claim 1.

7. A lead-free low-temperature solder as claimed in claim 1 which consists of 50-52 mass % of In, 0.01-0.4 mass % of Zn, and a balance of Bi.

8. A lead-free low-temperature solder as claimed in claim 1 which consists of 50-52 mass % of In, 0.01-0.4 mass % of La, and a balance of Bi.

9. A lead-free low-temperature solder as claimed in claim 1 which consists of 50-52 mass % of In, 0.01-0.4 mass % of Zn, 0.01-0.4 mass % of La, and a balance of Bi.

10. A lead-free low-temperature solder as claimed in claim 1 which consists of 50-52 mass % of In, 0.01-0.4 mass % of Zn, 0.001-0.01 mass % of P, and a balance of Bi.

11. A lead-free low-temperature solder as claimed in claim 1 which consists of 50-52 mass % of In, 0.01-0.4 mass % of La, 0.001-0.01 mass % of P, and a balance of Bi.

12. A lead-free low-temperature solder as claimed in claim 1 which consists of 50-52 mass % of In, 0.01-0.4 mass % of Zn, 0.01-0.4 mass % of La, 0.001-0.01 mass % of P, and a balance of Bi.

13. A lead-free low-temperature solder for bonding electronic parts consisting of 50-52 mass % of In, 0.001-0.01 mass % of P, optionally at least one of 0.01-0.4 mass % of Zn and 0.01-0.4 mass % of La, and a balance of Bi and having a solidus temperature of at least 85° C. and a liquidus temperature of at most 110° C. and having a $BiIn_2$ intermetallic compound and at least one intermetallic compound selected from $Bi_3In_5$ and BiIn present in its structure.

14. A solder joint which is bonded to an electronic part containing a semiconductor element and which is made from a lead-free low-temperature solder as claimed in claim 13.

15. A solder joint for an electronic part made from a lead-free low-temperature solder as claimed in claim 13.

16. A lead-free low-temperature solder as claimed in claim 13 which consists of 50-52 mass % of In, 0.001-0.01 mass % of P, and a balance of Bi.

* * * * *